(12) United States Patent
Nakamura

(10) Patent No.: US 6,781,216 B2
(45) Date of Patent: Aug. 24, 2004

(54) SEMICONDUCTOR DEVICE HAVING WIRING PATTERNS WITH INSULATING LAYER

(75) Inventor: Hiroki Nakamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/128,244

(22) Filed: Apr. 24, 2002

(65) Prior Publication Data
US 2002/0130383 A1 Sep. 19, 2002

Related U.S. Application Data

(63) Continuation of application No. 09/625,178, filed on Jul. 25, 2000.

(30) Foreign Application Priority Data

Dec. 27, 1999 (JP) .............................................. 11-369811

(51) Int. Cl.[7] ............................................. H01L 21/312
(52) U.S. Cl. ...................................... 257/637; 257/643
(58) Field of Search .......................... 438/622; 257/506, 257/632, 634, 635, 637, 641, 644

(56) References Cited

U.S. PATENT DOCUMENTS 5,798,298 A * 8/1998 Yang et al. .................. 438/622
5,808,363 A   9/1998 Watanabe .................... 257/758
6,261,883 B1 * 7/2001 Koubuchi et al. ........... 438/598

FOREIGN PATENT DOCUMENTS

| JP | 56-107570 | * 8/1981 | ............ H01L/27/04 |
|----|-----------|----------|------------------------|
| JP | 07-161706 | 6/1995 | ............ H01L/21/316 |
| JP | 08-181208 | * 12/1996 | ............ H01L/21/768 |
| JP | 09139431 A | 5/1997 | ............ H01L/21/82 |
| JP | 09-139431 | 5/1997 | ............ H01L/21/82 |
| JP | 10178011 A | 6/1998 | ............ H01L/21/3205 |
| JP | 10-270445 | * 10/1998 | ............ H01L/21/3205 |

* cited by examiner

Primary Examiner—Wael Fahmy
Assistant Examiner—Anh Duy Mai
(74) Attorney, Agent, or Firm—Junichi Mimura

(57) ABSTRACT

A semiconductor device includes a semiconductor substrate having a center area where an IC is formed and a peripheral area surrounding the center area, a first wiring pattern formed on the substrate in the center area, a second wiring pattern formed in the peripheral area wherein the second wiring pattern encompasses the center area, a first insulating layer formed over the center and peripheral areas, and a second insulating layer formed on the first insulating layer which is formed on the semiconductor substrate wherein the second insulating layer is not formed over the second wiring pattern.

5 Claims, 8 Drawing Sheets

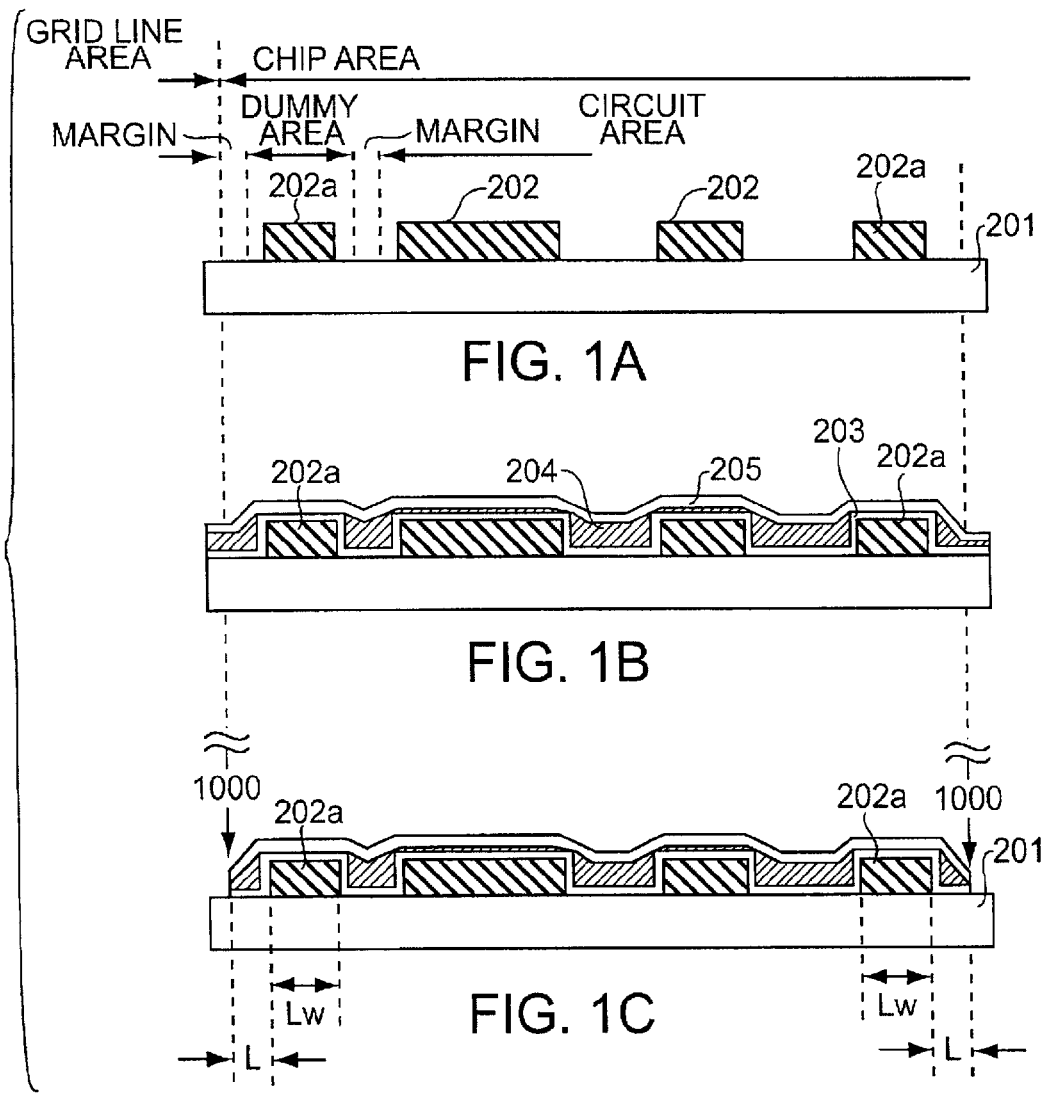

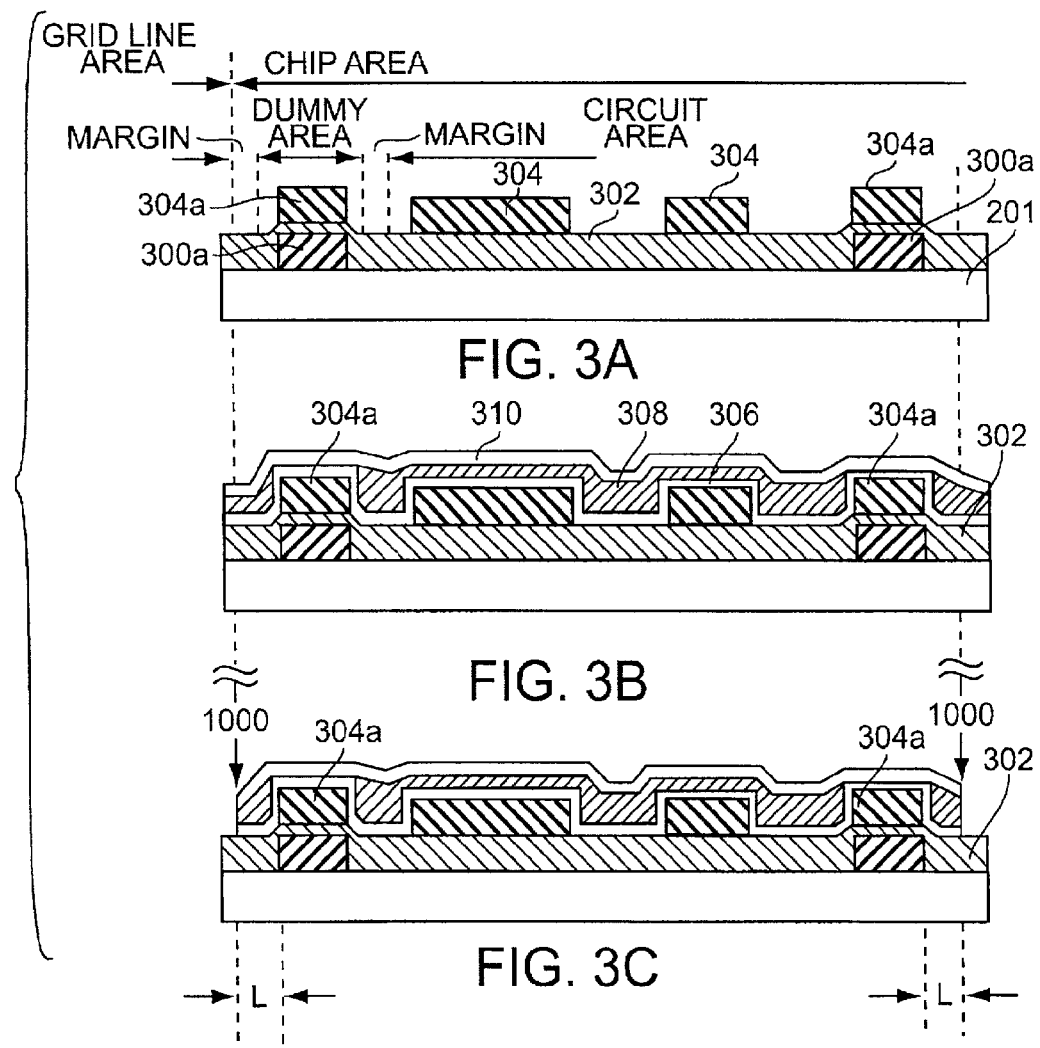

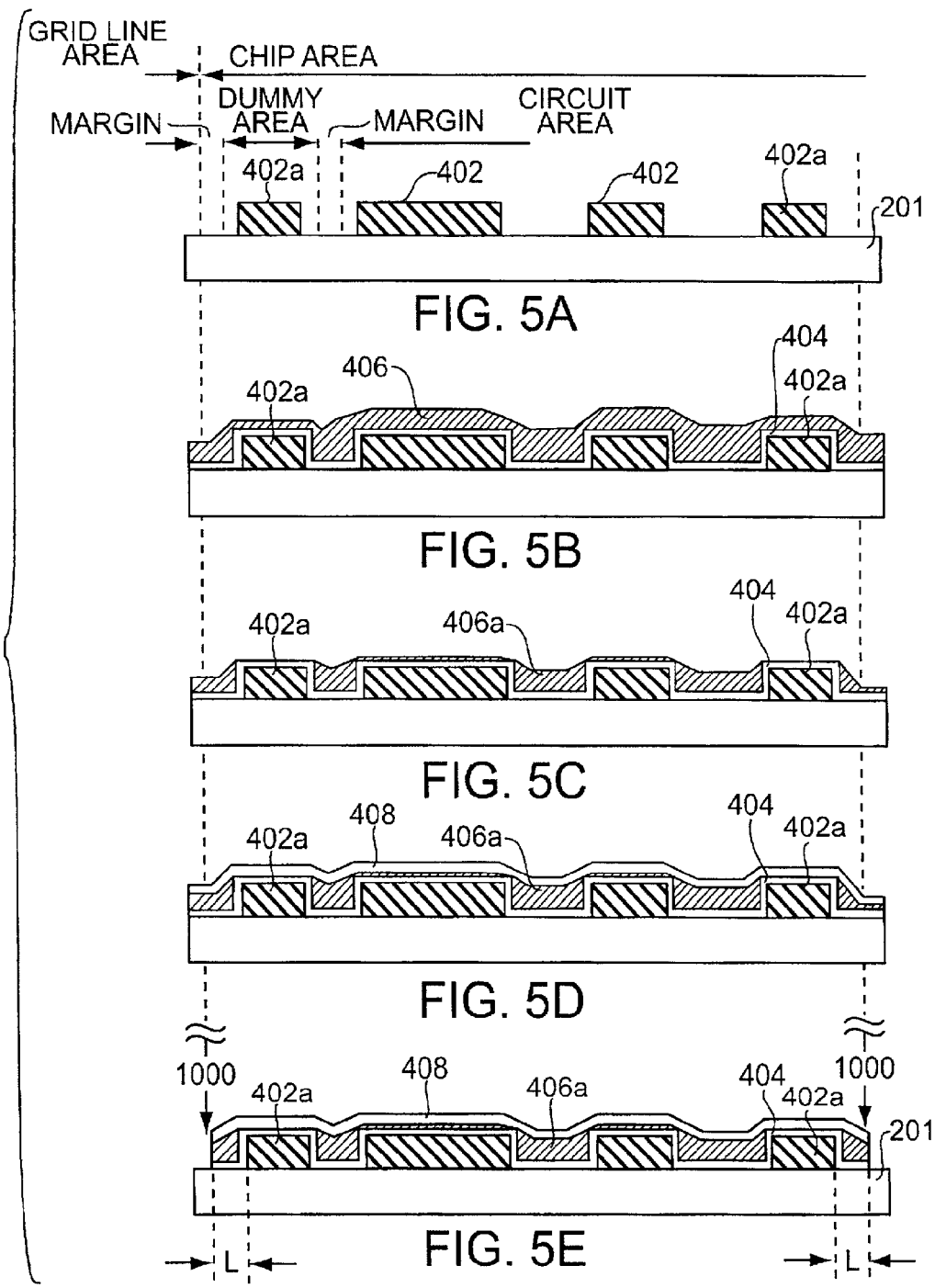

US 6,781,216 B2

SEMICONDUCTOR DEVICE HAVING WIRING PATTERNS WITH INSULATING LAYER

CROSS-REFERENCE TO RELATED APPLICATION

This application claims the priority benefit of Japanese Patent Application No. 11-369811, filed Dec. 27, 1999, the entire subject matter of which is incorporated herein of reference. This application is a continuation of co-pending application Ser. No. 09/625,178, filed Jul. 25, 2000.

BACKGROUND OF THE INVENTION

1. Field of the Invention

The invention relates to a semiconductor device, which has at least one dummy pattern to protect wiring patterns from corrosion.

2. Description of the Related Art

A semiconductor device having a metalized wiring pattern in the related art is formed by the process described below with reference to FIGS. 8A through 8C.

Referring to FIG. 8A, a semiconductor substrate 101 having circuit elements, such as transistors, in a circuit area of a chip area on its surface is prepared, and then, a metal layer which is formed of Aluminum are formed on the entire main-surface of the semiconductor substrate 101. Then, metalized wiring patterns 102 are formed by etching the metal layer to make an interconnection of the circuit elements.

Next, referring to FIG. 8B, a first insulating layer 103, such as a silicon oxide layer, is formed on the entire main-surface of the semiconductor substrate 101 and on the exposed surface of the metalized wiring patterns 102 by the CVD process. After that, a SOG (Spin On Grass) layer 104 as a second insulating layer is coated on the first insulating layer 103 to planarized its surface. According to the spin coating process, the thick SOG layer is formed in an area where no wiring patterns is formed, and the thin SOG layer is formed on the wiring patterns. Then, a third insulating layer 105, such as a silicon oxide layer, is formed on the SOG layer by the CVD process.

After that, referring to FIG. 8C, the first insulating layer 103, the SOG layer 104, the third insulating 105 layer only in an grid line area is removed to make an opening 106 until the surface of the semiconductor is exposed. This process is very important to avoid cracking the semiconductor device at the scribing process.

However, as the SOG layer is exposed at an edge 1000 of the opening 106, moisture comes into the semiconductor device because the SOG layer has hygroscopicity. As a result, the metalized wiring patterns are corroded.

SUMMARY OF THE INVENTION

An objective of the invention is to resolve the above-described problem and to provide a semiconductor device having a dummy pattern to protect wiring patterns formed in the semiconductor device from corrosion.

The objective is achieved by a semiconductor device including a semiconductor substrate having a grid-line area and a chip area, the chip area having a circuit area and a dummy area surrounding the circuit area, circuit patterns formed on the substrate in the circuit area, a first dummy pattern which is formed of the same material as the circuit pattern, formed in the dummy area, the dummy pattern encompassing the circuit area, a first insulating layer formed on an entire surface of the semiconductor substrate, a second insulating layer formed only on the first insulating layer which is formed on the semiconductor substrate and on the circuit patterns; and a third insulating layer formed on the exposed first insulating layer and the second insulating layer.

The objective is further achieved by a method for manufacturing a semiconductor device including a step for preparing a semiconductor substrate having a grid-line area and a chip area, the chip area having a circuit area and a dummy area surrounding the circuit area, a step for forming a conductivity layer on the semiconductor substrate, a step for forming circuit patterns in the circuit area and a dummy pattern encompassing the circuit area in the dummy area by etching the conductivity layer, a step for forming a first insulating layer formed on an entire surface of the semiconductor substrate, a step for forming a second insulating layer on the first insulating layer, a step for removing the second insulating layer which is formed on the first insulating layer on the dummy pattern until the surface of the first insulating layer is exposed, a step for forming a third insulating layer formed on the exposed first insulating layer and on the second insulating layer; and, a step for removing the first, second and third insulating layers in the grid-line area.

BRIEF DESCRIPTION OF THE DRAWINGS

The invention will be more particularly described with reference to the accompanying drawings in which:

FIGS. 1A through 1C are sequential sectional views for forming a semiconductor device of a first of fifth illustrative embodiments of the invention;

FIGS. 3A through 3C are sequential sectional views for forming a semiconductor device of a second of fifth illustrative embodiments of the invention;

FIG. 7b is a enlarged plan view of the semiconductor device shown in FIG. 7a.

DETAILED DESCRIPTION OF THE PREFERRED EMBODIMENTS

Figure 2A:
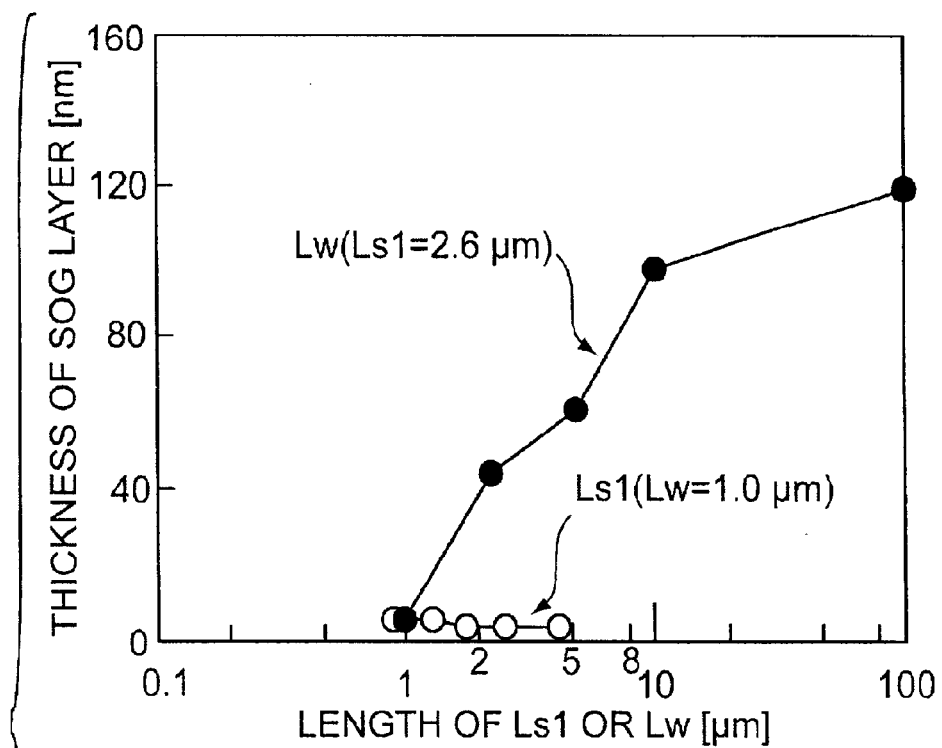
FIG. 2A is a graph showing a relationship between the thickness of a SOG layer formed on the dummy pattern and the width (Lw) of the dummy pattern or the length (LS) between the dummy pattern and metalized wiring pattern, of the first embodiment.

Referring to FIG. 1A, unillustrated circuit elements, such as transistors, are formed in a circuit area of the chip area on a main-surface of the semiconductor substrate 201, and then, an unillustrated insulating layer is formed on the surface of the semiconductor substrate 201. Next, a metal layer having a thickness of 600 nm, which is formed of Aluminum, is formed on the entire main-surface of the semiconductor substrate 201, and then, metalized wiring patterns 202 are formed in the circuit area by etching the metal layer to make an interconnection of the circuit elements. Simultaneously, a dummy pattern 202a, which is electrically isolated from the wiring pattern 202, is formed in a dummy area by etching the metal layer. The dummy area is disposed between the circuit area and the grid-line area. A manufacturing margin area is located on either side of the dummy area from the circuit area and grid-line area, respectively. For example, a frame-shaped dummy area having a width of (((1000−0.05)−(800+0.05))/2 $\mu$m is formed, providing that the chip area has 1000×1000 $\mu$m, the circuit area whose center is correspondence to a center of the chip area, has 800×800 $\mu$m, and width of the manufacturing margin is 0.05 $\mu$m. Therefore, the circuit area is encompassed with the dummy area. Although the dummy pattern 202a can be formed in the dummy area, preferably, the distance (L) between the edge 1000 of the chip area and an outer edge of the dummy pattern 202a is set for over 10 $\mu$m.

Next, referring to FIG. 1B, a first insulating layer 203, such as silicon oxide layer, having a thickness of 200 nm is formed by CVD on the entire surface of the semiconductor substrate 201. Then, a SOG layer 204 as a second insulating layer is coated only on the first insulating layer 203 which is directly formed on the semiconductor substrate 201 and which is formed on the metalized wiring patterns 202 to planarize the surface. That is, the SOG layer is not formed on the first insulating layer 203, which is formed on the dummy pattern 202a. The condition not to be formed the SOG layer on the dummy pattern is explained later. Then, a third insulating layer 205 having a thickness of 400 nm is formed by CVD on the SOG layer 204 and the exposed first insulating layer 203 which is formed on the dummy pattern 202a.

Then, referring to FIG. 1C, the first insulating layer 203, the SOG layer 204, and the third insulating layer 205 on the grid line area are removed until the surface of the semiconductor substrate 201 is exposed.

In the process shown in FIG. 1B, the SOG layer is coated in the following condition and the thickness of the SOG layer 204 on the dummy pattern 202a is measured in changing the width (Lw) of the dummy pattern 202a or the length (Ls1) between the dummy pattern 202a and metalized wiring pattern 202. A result of the measurement is shown in FIG. 2A.

(1) the material of the SOG layer: Concentration of Solid content is 5.2 wt %
(2) the material of the SOG layer: Viscosity is 1.03 mPa.sec.
(3) Rotary speed: 5000 rpm Referring to FIGS. 2A and 2B, the X axis shows the thickness of the SOG layer on the dummy pattern 202a, and Y axis shows the width (Lw) of the dummy pattern 202a or length (Ls1) between the dummy pattern 202a and metalized wiring pattern 202.

Figure 2B:
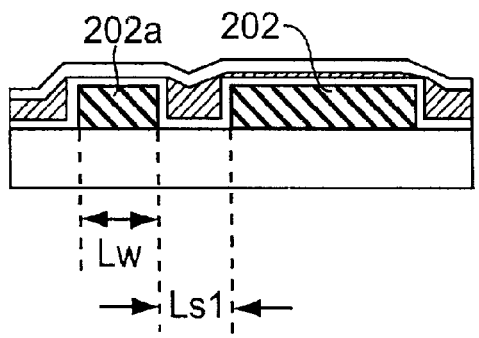
FIG. 2B is an enlarged sectional view at the edge of the circuit area to indicate the width (Lw) and the length (Ls1) which is used in FIG. 2A.

In FIG. 2A, the black circles shows the relationship between the thickness of the SOG layer and the width (Lw) of the dummy pattern 202a where the length (Ls1) is fixed to 2.6 $\mu$m and the width (Lw) is changed from 1 to 100 $\mu$m. In this case, it is found that if the width (Lw) is getting wider, the SOG layer becomes thicker. The with circles shows the relationship between the thickness of the SOG layer and the length (Ls1) where the width (Lw) is fixed to 1.0 $\mu$m and the length (Ls1) is changed from 0.9 to 5 $\mu$m. In this case, it is found that the thickness of the SOG layer on the dummy pattern 202a is maintained to nearly zero even if the length (Ls1) is set until 5 $\mu$m.

As a result form this experimentation, if the width (Lw) is designed to 1.0 $\mu$m, the SOG layer is not formed on the dummy pattern 202a. Therefore, if the dummy pattern 202a having a width of 1.0 $\mu$m is formed, the SOG layer 204 which is adjacent to the grid-line area is completely isolated from the SOG layer 204 which is formed in the circuit area by the first insulating layer 203 formed on the dummy pattern 203.

According to the first embodiment of the invention, as the SOG layer 204 which is adjacent to the grid-line area is completely isolated from the SOG layer 204 which is formed in the circuit area by the first insulating layer 203 formed on the dummy pattern 203, it is possible to protect the semiconductor device from moisture which comes into the semiconductor device through the SOG layer 204. Further, as the dummy pattern 202a can be formed with the metalized wiring patterns, simultaneously, it is not necessary to add some additional process. Furthermore, since the dummy pattern is formed outside of the circuit area, the surface of the semiconductor device at the peripheral area is planarized as the additional effect of the dummy pattern.

The second embodiment is described below with reference to FIGS. 3A through 3C and FIGS. 4A through 4B. Referring to FIG. 3A, unillustrated circuit elements, such as transistors, are formed in a circuit area of the chip area on a main-surface of the semiconductor substrate 201, and then, an unillustrated insulating layer is formed on the surface of the semiconductor substrate 201. Next, a tungsten polycide layer having a thickness of about 3000 $\mu$m is formed on the insulating layer, and then, a lower dummy pattern 300a (a second dummy pattern) is formed in a dummy area by etching the tungsten polycide layer. As well as the dummy area decried in the first embodiment, the dummy area of the second embodiment is disposed between the circuit area and the grid-line area. A manufacturing margin area is located on either side of the dummy area from the circuit area and grid-line area, respectively. Further, as well as the first dummy patterns 202a in the first embodiment, the lower dummy pattern 300a of the second embodiment having the width (Lw) can be formed anywhere in the dummy area, preferably, the distance (L) between the edge 1000 of the chip area and an outer edge of the lower dummy pattern 300a is set for over 10 $\mu$m. Also, the circuit area is encompassed with the lower dummy pattern 300a. Next, a borophosphosilicate glass (BPSG) layer 302 having a thickness of 800 nm is formed on the silicon substrate and the lower dummy pattern 300a. The impurity concentrations of P2O5 and B2O3 in BPSG layer are 15 wt % and 10 wt %, respectively. Then, a thermal treatment is performed to the BPSG layer 302 for thirty minutes at 900 C in the nitrogen atmosphere to planarize its surface. After that, an aluminum layer having a width of 600 nm is formed on the BPSG layer 302, and then, metalized wiring patterns 304 are formed in the circuit area by etching the metal layer to make an interconnection of the circuit elements. Simultaneously, an upper dummy pattern 304a (first dummy pattern), which is electrically isolated from the wiring pattern 304, is formed above the lower dummy pattern 300a. The shape and side of the upper dummy pattern 304a are almost the same as the lower dummy pattern 302a.

Next, referring to FIG. 3B, a first insulating layer 306, such as silicon oxide layer, having a thickness of 200 nm is formed by CVD on the surface of the BPSG layer 302, on the surface of metalized wiring patterns 304 and on the upper dummy pattern 304a. Then, a SOG layer 308 as a second insulating layer is coated only on the first insulating layer 306 which the lower dummy pattern 300a is not formed thereunder to planarize the surface. That is, the SOG layer is not formed on the first insulating layer 306 which is formed on the upper dummy pattern 304a. The condition not to be formed the SOG layer on the upper dummy pattern 304a is explained later. Then, a third insulating layer 310 having a thickness of 400 nm is formed by CVD on the SOG layer 308 and on the exposed first insulating layer 306 which is formed on the upper dummy pattern 304a.

Then, referring to FIG. 3C, the first insulating layer 306, the SOG layer 308, and the third insulating layer 310 on the grid line area are removed until the surface of the BPSG layer 302 is exposed.

In the process shown in FIG. 3B, the SOG layer 308 is coated in the following condition and the thickness of the SOG layer 308 on the upper dummy pattern 304a is measured in changing the width (Lw) of the lower and upper dummy pattern 302a, 304a or the length (Ls1) between the lower and upper dummy pattern 302a, 304a and metalized wiring pattern 304. A result of the measurement is shown in FIG. 4A.

(4) the material of the SOG layer: Concentration of Solid content is 5.2 wt %
(5) the material of the SOG layer: Viscosity is 1.03 mPa.sec.
(6) Rotary speed: 5000 rpm Referring to FIGS. 4A and 4B, the X axis shows the thickness of the SOG layer on the upper dummy pattern 304a, and Y axis shows the width (Lw) of the lower and upper dummy pattern 302a, 304a or length (Ls1) between the lower and upper dummy pattern 302a, 304a and metalized wiring pattern 304.

Figure 4A:
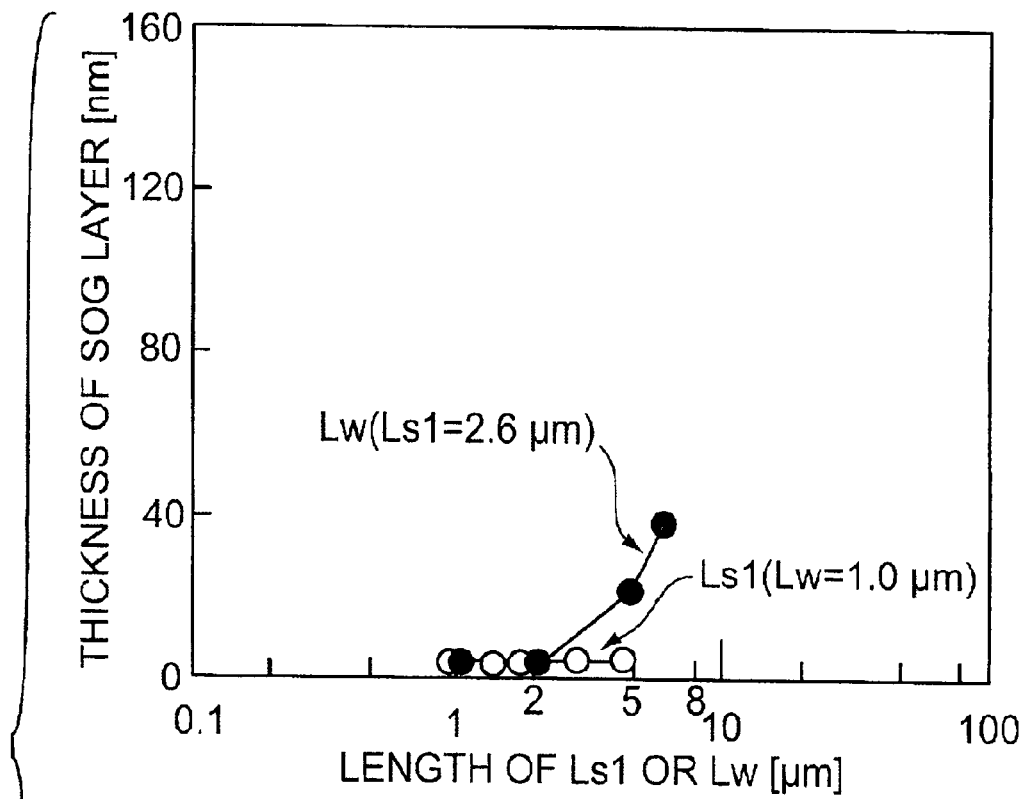
FIG. 4A is a graph showing a relationship between the thickness of a SOG layer formed on the second dummy pattern and the width (Lw) of the second dummy pattern or the length (Ls1) between the second dummy pattern and metalized wiring pattern, of the second embodiment.
Figure 4B:
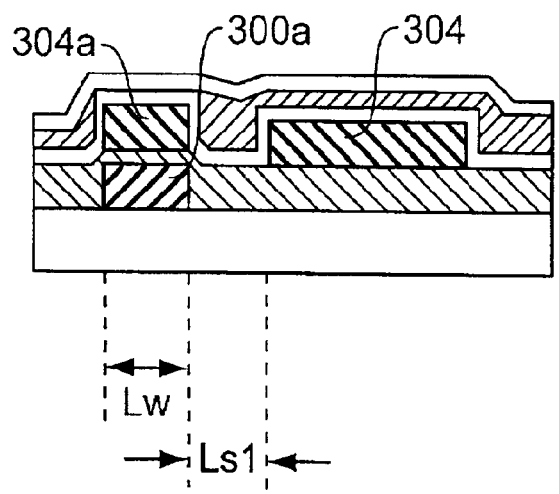
FIG. 4B is an enlarged sectional view at the edge of the circuit area to indicate the width (Lw) and the length (Ls1) which is used in FIG. 4A FIGS. 5A through 5E are sequential sectional views for forming a semiconductor device of a third of fifth illustrative embodiments of the invention.
Figure 6:
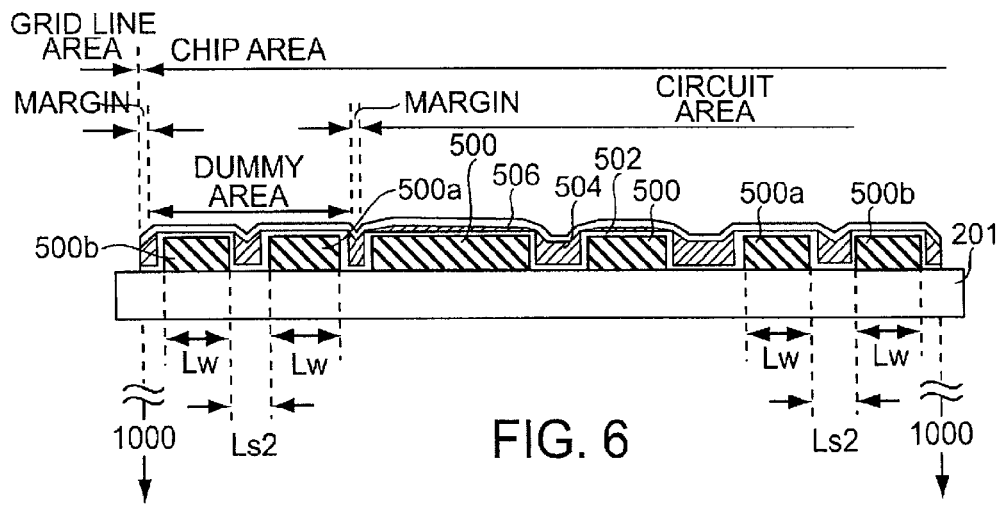
FIG. 6 is a sectional view of a semiconductor device of a fourth of fifth illustrative embodiments of the invention.

In FIG. 4A, the black circles shows the relationship between the thickness of the SOG layer and the width (Lw) of the lower and upper dummy pattern 302a, 304a where the length (Ls1) is fixed to 2.6 μm and the width (Lw) is changed from 1 to 7 μm. In this case, it is found that the SOG layer becomes thicker if the width (Lw) is designed for over 2 μm,. The with circles shows the relationship between the thickness of the SOG layer and the length (Ls1) where the width (Lw) is fixed to 1.0 μm and the length (Ls1) is changed from 0.9 to 5 μm. In this case, it is found that the thickness of the SOG layer on the second dummy pattern 304a is maintained to nearly zero even if the length (Ls1) is designed until 5 μm.

As a result form this experimentation, if the width (Lw) is set to 1 μm–2 μm the SOG layer is not formed on the upper dummy pattern 304a. Therefore, if the upper dummy pattern 304a having a width of 1 μm–2 μm is formed, the SOG layer 308 which is adjacent to the grid-line area is completely isolated from the SOG layer 308 which is formed in the circuit area by the first insulating layer 306 formed on the upper dummy pattern 304a.

According to the second embodiment of the invention, in addition to the benefits of the first embodiment, the following advantages can be obtained.

Although the material of the lower dummy pattern 302a is not limited for the metal such as tungsten polycide, if it is formed of the conductivity material, metalized wiring patterns can be formed with the lower dummy pattern 302a. Further, the second embodiment of the invention can be adapted to any semiconductor device having multi-wiring layers without any additional processes. Furthermore, as the width (Lw) of the lower and upper dummy pattern 302a, 304a can be designed with a range from 1 μm to 2 μm, it becomes easier to design the total semiconductor device.

The third embodiment is described below with reference to FIGS. 5A through 5D. Referring to FIG. 5A, unillustrated circuit elements, such as transistors, are formed in a circuit area of the chip area on a main-surface of the semiconductor substrate 201, and then, an unillustrated insulating layer is formed on the surface of the semiconductor substrate 201. Next, a metal layer which, is formed of Aluminum, is formed on the entire main-surface of the semiconductor substrate 201, and then, metalized wiring patterns 402 are formed in the circuit area by etching the metal layer to make an interconnection of the circuit elements. Simultaneously, a first dummy pattern 402a, which is electrically isolated from the wiring pattern 402, is formed in a dummy area by etching the metal layer. As well as in the first and second embodiment, the dummy area is disposed between the circuit area and the grid-line area. A manufacturing margin area is located on either side of the dummy area from the circuit area and grid-line area, respectively. Further, as well as in the first embodiment, the first dummy pattern 402a of the third embodiment having the width (Lw) can be formed anywhere in the dummy area, preferably, the distance (L) between the edge 1000 of the chip area and an outer edge of the first dummy pattern 402a is set for over 10 μm. Also, the circuit area is encompassed with the first dummy pattern 402a.

Next, referring to FIG. 5B, a first insulating layer 404, such as silicon oxide layer, having a thickness of 200 nm is formed by CVD on the entire surface of the semiconductor substrate 201. Then, a multi-SOG layer 406 as a second insulating layer is formed on the first insulating layer 404 to planarize its surface. The multi-SOG layer 406 is formed by coating a SOG layer few times. That is, a first SOG layer is coated on the first insulating layer 404. Then, after it is dried up, a second SOG layer is coated on the dried SOG layer.

Next, referring to FIG. 5C, the multi-SOG layer is etched by the well-known RIE method under the conditions below until the surface of the first insulating layer 404 on the first dummy pattern 402a is exposed.
(a) Gas flow rate: CHF3/CF4/Ar=20/15/200 [sccm]
(b) Pressure: 40 [Pa]
(c) RF power: 200 [W]
(d) Etching rate of the multi-SOG layer: 7.5 [nm/sec]

Next, referring to FIG. 5D, the third insulating layer 408 having a thickness of 400 nm is formed by CVD on the multi-SOG layer 406 and the exposed first insulating layer 404 which is formed on the first dummy pattern 402a.

Then, referring to FIG. 5E, the first insulating layer 404, the multi-SOG layer 406, and the third insulating layer 408 on the grid line area are removed until the surface of the semiconductor substrate 201 is exposed.

According to the third embodiment of the invention, in addition to the benefits of the first embodiment, the following advantages can be obtained. In the first and second embodiments, the SOG layer can not be formed thick. If it were formed thick, it would be formed on the first insulating layer on the first dummy pattern. However, as the multi-SOG layer can be formed thick in the third embodiment, the planarized surface can be obtained in the circuit area.

The fourth embodiment is described below with reference to FIG. 7. Referring to FIG. 7, a pair of inner and outer dummy patterns 500a, 500b (a third dummy pattern and a first dummy pattern) are formed in the dummy area. Each dummy pattern has a same width (Lw), and formed in the same method with the same size described in the first embodiment. The length (Ls2) between the dummy patterns 500a, 500b is designed for over 0.9 μm.

According to the fourth embodiment, in addition to the benefits of the first embodiment, the following advantages can be obtained.

Even If the SOG layer 504 is formed on the first insulating layer 502 on the outer dummy pattern 500b by accident, the semiconductor device can be protected from the moisture because the SOG layer 504 formed on the outer dummy pattern 500b is isolated from the SOG layer 504 formed in the circuit are by the insulating layer formed on the inner dummy pattern 500a.

Figure 7A:
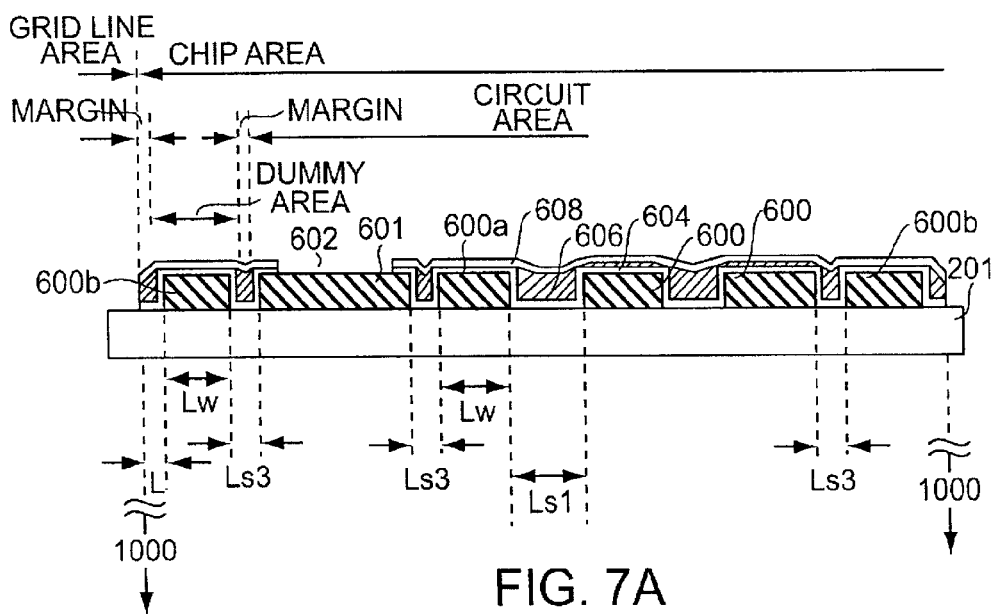
FIG. 7a is a sectional view of a semiconductor device of a fifth of fifth illustrative embodiments of the invention.
Figure 7B:
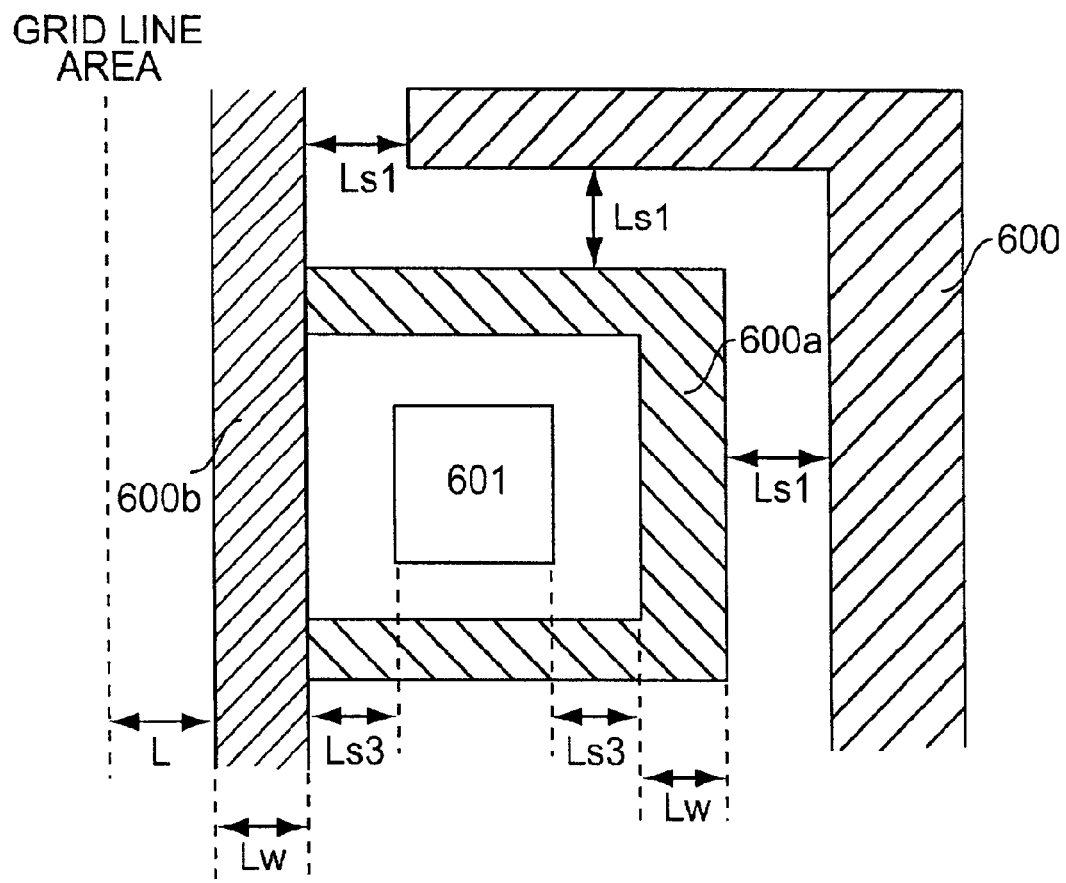
Figure 8A:
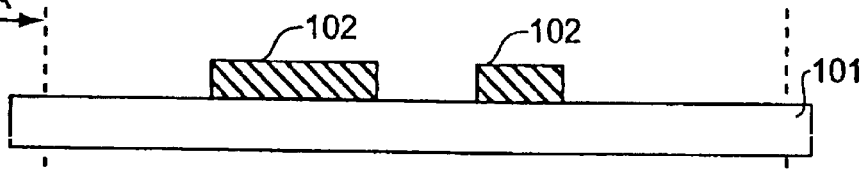
FIGS. 8A through 8C are sequential sectional views for forming a semiconductor device in the related art.
Figure 8B:
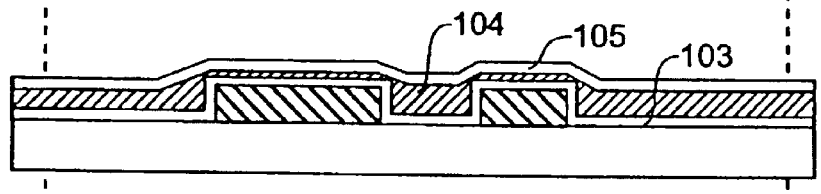
Figure 8C:
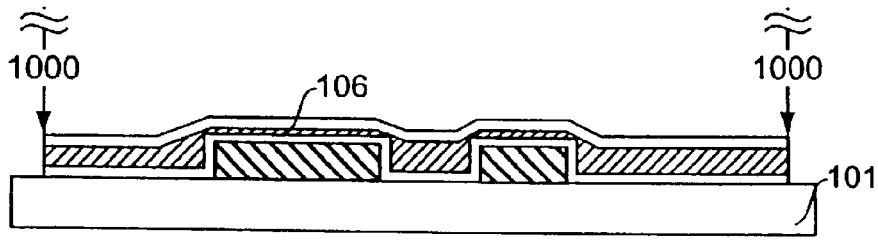

The fifth embodiment is described below with reference to FIGS. 7A and 7B. A bonding pad 601 is formed in a circuit area, and an outer dummy pattern 600a (a first dummy pattern) is formed in a dummy area. The size, location and manufacturing process of the outer dummy pattern is the same as the dummy pattern described in the first embodiment. That is, a width of the outer dummy pattern is designed for 1 μm, and the length (L) is designed for 10 μm. A frame-shaped fourth dummy pattern 600b is formed for surrounding the bonding pad 601 in the circuit area. The distance (Ls3) between the bonding pad 601 and the fourth dummy pattern 600b or the outer dummy pattern 600a is designed for over 0.9 μm. The distance (Ls1) between the metalized wiring pattern 600 and the outer dummy pattern 600a or the fourth dummy pattern is designed for over 0.5 μm because of the same reason described in the first embodiment. The metalized wiring pattern 600, the outer dummy pattern 600b and the fourth dummy pattern 600a are formed simultaneously by etching a conductive layer.

According to the fifth embodiment, in addition to the benefits of the first embodiment, the following advantages can be obtained. As the bonding pad 601 is surrounded by the fourth dummy pattern 600a, an SOG layer 606, which is exposed to an opening 602 for the bonding pad 601 is isolated to the SOG layer 606 which is formed in the circuit area. Therefore, it is possible to protect the semiconductor device from moisture which comes into the semiconductor device through the SOG layer 204 exposed to the opening 602.

While the invention has been described with reference to illustrative embodiments, this description is not intended to be construed in a limiting sense. For example, although silicon oxide layers are used for the first and third insulating layer in the first through fifth embodiment, a silicon nitride layer, a PSG layer, a BPSG layer can be used. Further, it is possible to change the width of the dummy patterns in the first through fifth embodiment based on the concentration of solid content of the SOG layer. If a high concentrate material for the SOG layer is used, the dummy pattern having a wide width may be formed. On the contrary, If a low concentrate material for the SOG layer is used, the dummy pattern having a short width may be formed. Also, in the third embodiment, it is possible to change the etching time based on the concentration of solid content of the SOG layer. Furthermore, in the second embodiment, the BPSG layer can be changed to other layer having thermal plagiarizing characteristics, such as a PSG layer. Various modifications of the illustrated embodiments, as well as other embodiments of the invention, will be apparent to those skilled in the art on reference to this description. Therefore, the appended claims are intended cover any such modifications or embodiments as fall within the true scope of the invention.

What I claim is:

1. A semiconductor device comprising a semiconductor substrate having a center area where an integrated circuit is to be formed and a peripheral area surrounding the center area;

a first wiring pattern formed on the substrate in the center area, the first wiring pattern including a pad pattern;

a second wiring pattern, which is formed of the same material as the first wiring pattern formed in the peripheral area along an edge of the semiconductor substrate;

a third wiring pattern, which is formed of the same material as the first wiring pattern and is connected to the second wiring pattern, formed in the peripheral area, the third wiring pattern encompassing a part of the center area; and an insulating layer formed above the semiconductor substrate, the insulating layer being formed outside the second and third wiring pattern but not being formed over the second and third wiring pattern, wherein an edge of the insulating layer is located on the pad pattern, which is adjacent to the second wiring pattern.

2. A semiconductor device as claimed in claim 1, wherein the first insulating layer has a moisture absorbable characteristic.

3. A semiconductor device as claimed in claim 1, wherein the first insulating layer is an SOG layer.

4. A semiconductor device as claimed in claim 1, wherein the second wiring pattern has a width, which is fixed by a concentration of solid content of the insulating layer.

5. A semiconductor device as claimed in claim 1, further comprising a third insulating layer formed on the substrate, the first insulating layer being located between the second insulating layer and the third insulating layer.

* * * * *